United States Patent
Kwak et al.

(10) Patent No.: US 9,779,837 B1
(45) Date of Patent: Oct. 3, 2017

(54) SEMICONDUCTOR TEST SYSTEM DURING BURN-IN PROCESS

(71) Applicant: SK hynix Inc., Icheon-si, Gyeonggi-do (KR)

(72) Inventors: Myung Kyun Kwak, Yongin-si (KR); Tae Yong Lee, Seoul (KR); Geun Ho Choi, Icheon-si (KR)

(73) Assignee: Sk hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/240,125

(22) Filed: Aug. 18, 2016

(30) Foreign Application Priority Data

Mar. 9, 2016 (KR) ........................ 10-2016-0028349

(51) Int. Cl.
   *G11C 29/12*   (2006.01)
   *G11C 8/06*    (2006.01)
   *G11C 29/44*   (2006.01)

(52) U.S. Cl.
   CPC .......... *G11C 29/12015* (2013.01); *G11C 8/06* (2013.01); *G11C 29/4401* (2013.01)

(58) Field of Classification Search
   CPC .. G11C 29/12015; G11C 29/4401; G11C 8/06
   USPC ................ 365/201; 711/170, 200, 202, 206
   See application file for complete search history.

(56) References Cited

U.S. PATENT DOCUMENTS

| | | | |
|---|---|---|---|
| 6,337,814 B1* | 1/2002 | Tanida | G11C 29/12 327/537 |
| 2001/0015924 A1* | 8/2001 | Arimoto | G01R 31/3172 365/201 |
| 2001/0040829 A1* | 11/2001 | Arimoto | G11C 29/48 365/189.02 |
| 2003/0031082 A1* | 2/2003 | Sawada | G11C 7/1066 365/233.1 |
| 2003/0085731 A1* | 5/2003 | Iwase | G01R 31/31701 326/16 |
| 2004/0052132 A1* | 3/2004 | Fuhrmann | G11C 11/408 365/202 |
| 2009/0158224 A1 | 6/2009 | Barth, Jr. et al. | |
| 2012/0224433 A1* | 9/2012 | Mochida | G01R 31/2856 365/185.27 |
| 2012/0327724 A1* | 12/2012 | Kawakubo | G11C 8/08 365/189.07 |
| 2015/0162101 A1* | 6/2015 | Ware | G11C 29/846 714/764 |

FOREIGN PATENT DOCUMENTS

KR   1020120117347 A   10/2012

* cited by examiner

*Primary Examiner* — Vu Le
*Assistant Examiner* — Sung Cho
(74) *Attorney, Agent, or Firm* — William Park & Associates Ltd.

(57) ABSTRACT

A command generation circuit, test control circuit, semiconductor device, semiconductor system, and or a test method may be provided. The semiconductor device may be configured to enter test modes and to generate internal commands during a clock cycle.

19 Claims, 5 Drawing Sheets

SEMICONDUCTOR TEST SYSTEM DURING BURN-IN PROCESS

CROSS-REFERENCE TO RELATED APPLICATION

The present application claims priority under 35 U.S.C. §119(a) to Korean Patent Application No. 10-2016-0028349 filed on Mar. 9, 2016 in the Korean Intellectual Property Office, which is incorporated herein by reference in its entirety.

BACKGROUND

1. Technical Field

Embodiments of the present disclosure may generally relate to a test method for performing a test and circuits, semiconductor devices and semiconductor systems using related test method.

2. Related Art

Recently, as the design and manufacture of a semiconductor device becomes more complex, a process for testing the semiconductor device also becomes more complex and difficult to perform. As the process for testing the semiconductor device of which the degree of integration is increased, a lengthy period of test time is required to perform the test process.

As a method for shortening a test time and thereby reducing required costs, a method capable of replacing a test process requiring a lengthy period of time has been developed. A representative example includes a test during burn-in (TDBI) process that is performed after the package of a semiconductor device is manufactured. The TDBI process is one of the test processes for determining a pass or a fail by applying a stress through iterating a write operation of a simple pattern, for a semiconductor device which is manufactured as a package. In detail, the TDBI process is a process of applying a stress to a semiconductor device by operating the semiconductor device with a simple write pattern at a relatively high temperature (of 100 Celsius degrees at maximum) with a relatively high voltage for a long time (several hours at maximum), after packaging.

Meanwhile, in order to efficiently test a semiconductor device before packaging, a method has been proposed, in which the semiconductor device includes therein a built-in self-test (BIST) circuit.

SUMMARY

In an embodiment or embodiments, a command generation circuit, test control circuit, semiconductor device, semiconductor system, and or a test method may be provided. The semiconductor device may be configured to enter test modes and to generate internal commands during a clock cycle.

DETAILED DESCRIPTION

Hereinafter, a test method and a semiconductor system using the same will be described below with reference to the accompanying drawings through various examples of embodiments.

Various embodiments may be directed to a test method capable of setting a parameter for performing a test, from command addresses during one cycle of a clock, and a semiconductor system using the same.

According to some embodiments, since it is possible to set a parameter for performing a test, from command addresses during one cycle of a clock, advantages are provided in that a test time may be shortened.

According to some embodiments, since it is possible to set a parameter for performing a test, from command addresses during one cycle of a clock, advantages are provided in that a test may be performed at a high speed by using test equipment having a low operation speed.

Figure 1:
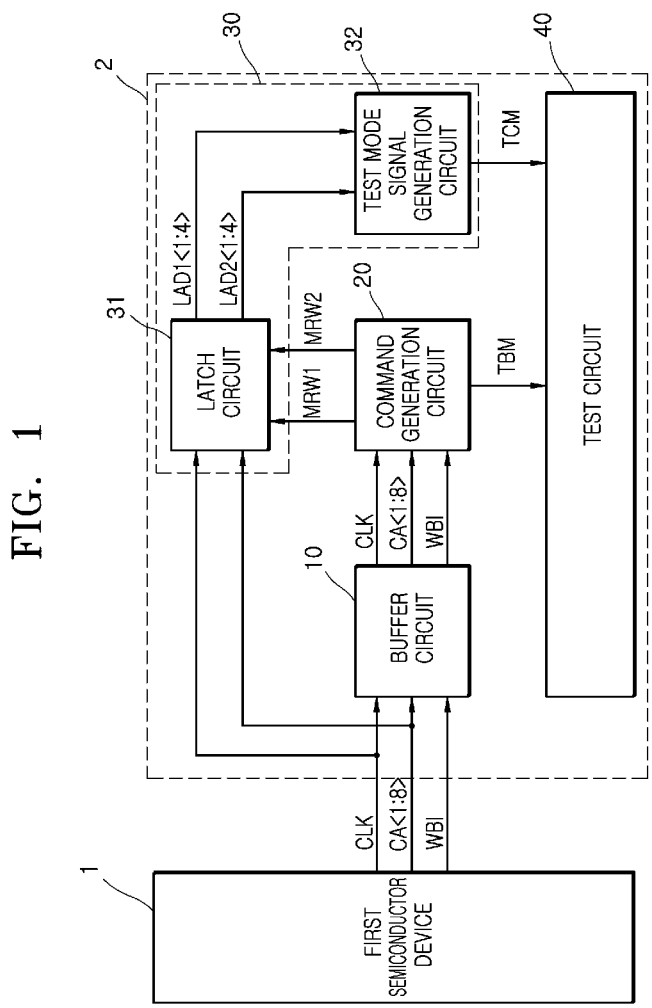
FIG. 1 is a block diagram illustrating a representation of an example of the configuration of a semiconductor system in accordance with an embodiment.

Referring to FIG. 1, a semiconductor system in accordance with an embodiment may include a first semiconductor device 1 and a second semiconductor device 2. The second semiconductor device 2 may include a buffer circuit 10, a command generation circuit 20, a test control circuit 30, and a test circuit 40.

The first semiconductor device 1 may output a clock CLK, command addresses CA<1:8> and a burn-in test signal WBI. The command addresses CA<1:8> may be transmitted through lines through which at least ones of addresses, commands and data are transmitted. The command addresses CA<1:8> may be successively transmitted through one line. The number of bits included in the command addresses CA<1:8> may be set variously according to embodiments. The burn-in test signal WBI may be set as a signal which is enabled in a first test mode where a stress is applied to a semiconductor device in such a way as to iteratively operate the semiconductor device by applying a high voltage for a long time at a high temperature. The first test mode means BISS according to an embodiment, as will be described later. The first semiconductor device 1 may be realized by general test equipment.

The buffer circuit 10 may buffer and transfer the clock CLK. The buffer circuit 10 may buffer and transfer the command addresses CA<1:8>. The buffer circuit 10 may buffer and transfer the burn-in test signal WBI. The buffer circuit 10 may include a general buffer which is realized by an inverter or a differential amplifier.

The command generation circuit 20 may generate a test command TBM according to the combination of the command addresses CA<1:8> in response to the burn-in test signal WBI. The command generation circuit 20 may generate the test command TBM which is enabled in the case where the burn-in test signal WBI is enabled and the combination of the command addresses CA<1:8> is a first combination. The command generation circuit 20 may generate the test command TBM which is disabled in the case where the burn-in test signal WBI is enabled and the combination of the command addresses CA<1:8> is a second combination. The command generation circuit 20 may generate a first internal command MRW1 and a second internal command MRW2 which are sequentially enabled during one cycle of the clock CLK. The operation of generating the test command TBM, the first internal command MRW1 and the second internal command MRW2 in the command generation circuit 20 will be explained below through a configuration which will be described later.

The test control circuit 30 may include a latch circuit 31 and a test mode signal generation circuit 32.

The latch circuit 31 may latch the command addresses CA<1:4> at the rising edge of the clock CLK in response to the first internal command MRW1, and generate first latch addresses LAD1<1:4>. The latch circuit 31 may latch the command addresses CA<5:8> at the falling edge of the clock CLK in response to the second internal command MRW2, and generate second latch addresses LAD2<1:4>.

The test mode signal generation circuit 32 may generate a test mode signal TCM by the first latch addresses LAD1<1:4> and the second latch addresses LAD2<1:4>. While the test mode signal TCM is set as one signal, it is to be noted that, according to an embodiment, the test mode signal TCM may be set as a plurality of signals for setting parameters for internal operations of the test circuit 40.

The test control circuit 30 configured in this way may latch the command addresses CA<1:4> at the rising edge of the clock CLK and latch the command addresses CA<5:8> at the falling edge of the clock CLK in response to the first internal command MRW1 and the second internal command MRW2, and may generate the test mode signal TCM from the latched command addresses CA<1:8>.

The test circuit 40 may enter a second test mode in response to the test mode signal TCM in the case where the test command TBM is enabled, and operate in such a way as to be set with the parameters for the internal operations, by the test mode signal TCM. The test circuit 40 may enter the first test mode in the case where the test command TBM is disabled, and perform a repair operation. The test circuit 40 may be realized by a memory device which includes a general memory cell array.

The parameters for the internal operations of the test circuit 40 may be set as a tRC (row address strobe (RAS) cycle time), a tRAS (RAS active time), a tCAS (column address strobe (CAS) active time), a tRP (RAS precharge time) and a tWR (write recovery time).

Figure 2:
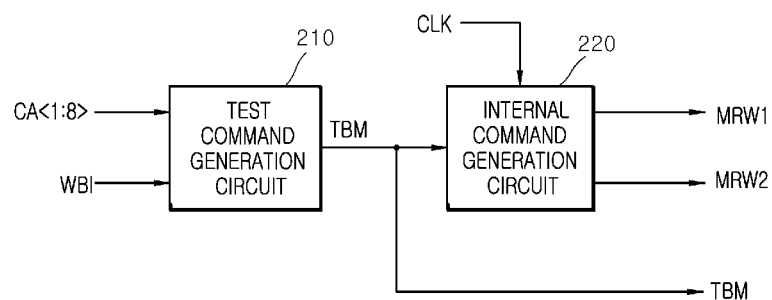
FIG. 2 is a block diagram illustrating a representation of an example of the configuration of the command generation circuit included in the semiconductor system illustrated in FIG. 1.

Referring to FIG. 2, the command generation circuit 20 in accordance with an embodiment may include a test command generation circuit 210 and an internal command generation circuit 220.

The test command generation circuit 210 may generate the test command TBM which is enabled in the case where the command addresses CA<1:8> are the first combination, in response to the burn-in test signal WBI. The test command generation circuit 210 may generate the test command TBM which is disabled in the case where the command addresses CA<1:8> are the second combination, in response to the burn-in test signal WBI. The test command TBM may be set as a signal which is enabled to enter the second test mode for setting the parameters of the internal operations of the test circuit 40. The second test mode means BIST according to an embodiment, as will be described later.

For example, the operation of generating the test command TBM according to the combination of the command addresses CA<1:8> in the test command generation circuit 210 is as follows.

The test command generation circuit 210 may generate the test command TBM which is enabled to a logic high level in the case where the burn-in test signal WBI is enabled and the combination of the command addresses CA<1:8> is the first combination. The test command generation circuit 210 may generate the test command TBM which is disabled to a logic low level in the case where the burn-in test signal WBI is enabled and the combination of the command addresses CA<1:8> is the second combination. The case where the combination of the command addresses CA<1:8> is the first combination means the case where all bits of the command addresses CA<1:8> are a logic high level. The case where the combination of the command addresses CA<1:8> is the second combination means the case where all bits of the command addresses CA<1:8> are a logic low level. The combination of the command addresses CA<1:8> for generating the test command TBM may be set variously according to embodiments. Further, the logic levels of the signals may be different from or the opposite of those described. For example, a signal described as having a logic "high" level may alternatively have a logic "low" level, and a signal described as having a logic "low" level may alternatively have a logic "high" level.

The internal command generation circuit 220 may generate the first internal command MRW1 which is generated in synchronization with the rising edge of the clock CLK, in response to the test command TBM. The internal command generation circuit 220 may generate the second internal command MRW2 which is generated in synchronization with the falling edge of the clock CLK, in response to the test command TBM.

Figure 3:
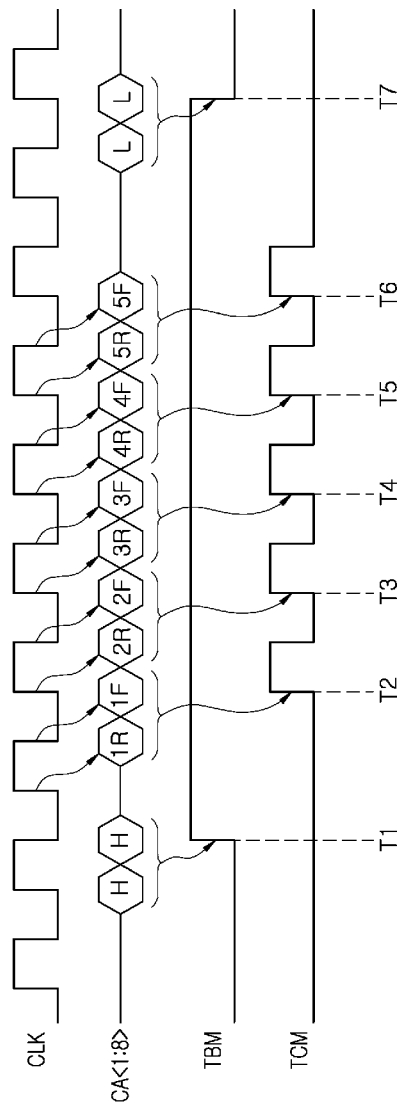
FIG. 3 is a representation of an example of a timing diagram to assist in the explanation of the operation of the semiconductor system in accordance with an embodiment.

The operation of the semiconductor system in accordance with an embodiment, configured as mentioned above, will be described below with reference to FIG. 3, by taking, as an example, the operation of setting the parameters of the internal operations by entering the second test mode BIST during the first test mode BISS.

The first semiconductor device 1 outputs the clock CLK, the command addresses CA<1:8> and the burn-in test signal WBI. The clock CLK is outputted while toggling. The command addresses CA<1:8> are outputted as the first combination. The burn-in test signal WBI is outputted by being enabled, to enter the first test mode BISS.

The buffer circuit 10 buffers and transfers the clock CLK, the command addresses CA<1:8> and the burn-in test signal WBI.

At a point of time T1, the test command generation circuit 210 generates the test command TBM which is enabled to the logic high level, in response to the burn-in test signal WBI, since the command addresses CA<1:8> are the first combination. The first combination of the command addresses CA<1:8> means the case where all bits of the command addresses CA<1:8> are a logic high level H.

The internal command generation circuit 220 generates the first internal command MRW1 which is generated in synchronization with a first rising edge 1R of the clock CLK, in response to the test command TBM of the logic high level. The first rising edge 1R means the first rising edge of the clock CLK after the test command TBM is generated.

The latch circuit 31 latches the command addresses CA<1:4> synchronized with the first rising edge 1R of the clock CLK in response to the first internal command MRW1, and generates the first latch addresses LAD1<1:4>.

The internal command generation circuit 220 generates the second internal command MRW2 which is generated in synchronization with a first falling edge 1F of the clock CLK, in response to the test command TBM of the logic high level. The first falling edge 1F means the first falling edge of the clock CLK after the test command TBM is generated.

The latch circuit 31 latches the command addresses CA<5:8> synchronized with the first falling edge 1F of the clock CLK in response to the second internal command MRW2, and generates the second latch addresses LAD2<1:4>.

At a point of time T2, the test mode signal generation circuit 32 generates the test mode signal TCM by the first latch addresses LAD1<1:4> generated at the first rising edge 1R of the clock CLK and the second latch addresses LAD2<1:4> generated at the first falling edge 1F of the clock CLK.

The test circuit 40 is set with the parameter of an internal operation by the test command TBM and the test mode signal TCM of logic high levels. The parameter of the internal operation set by the test mode signal TCM may be set as a tRC (RAS cycle time).

The internal command generation circuit 220 generates the first internal command MRW1 which is generated in synchronization with a second rising edge 2R of the clock CLK, in response to the test command TBM of the logic high level. The second rising edge 2R means the second rising edge of the clock CLK after the test command TBM is generated.

The latch circuit 31 latches the command addresses CA<1:4> synchronized with the second rising edge 2R of the clock CLK in response to the first internal command MRW1, and generates the first latch addresses LAD1<1:4>.

The internal command generation circuit 220 generates the second internal command MRW2 which is generated in synchronization with a second falling edge 2F of the clock CLK, in response to the test command TBM of the logic high level. The second falling edge 2F means the second falling edge of the clock CLK after the test command TBM is generated.

The latch circuit 31 latches the command addresses CA<5:8> synchronized with the second falling edge 2F of the clock CLK in response to the second internal command MRW2, and generates the second latch addresses LAD2<1:4>.

At a point of time T3, the test mode signal generation circuit 32 generates the test mode signal TCM by the first latch addresses LAD1<1:4> generated at the second rising edge 2R of the clock CLK and the second latch addresses LAD2<1:4> generated at the second falling edge 2F of the clock CLK.

The test circuit 40 is set with the parameter of an internal operation by the test command TBM and the test mode signal TCM of the logic high levels. The parameter of the internal operation set by the test mode signal TCM may be set as a tRAS (RAS active time).

The internal command generation circuit 220 generates the first internal command MRW1 which is generated in synchronization with a third rising edge 3R of the clock CLK, in response to the test command TBM of the logic high level. The third rising edge 3R means the third rising edge of the clock CLK after the test command TBM is generated.

The latch circuit 31 latches the command addresses CA<1:4> synchronized with the third rising edge 3R of the clock CLK in response to the first internal command MRW1, and generates the first latch addresses LAD1<1:4>.

The internal command generation circuit 220 generates the second internal command MRW2 which is generated in synchronization with a third falling edge 3F of the clock CLK, in response to the test command TBM of the logic high level. The third falling edge 3F means the third falling edge of the clock CLK after the test command TBM is generated.

The latch circuit 31 latches the command addresses CA<5:8> synchronized with the third falling edge 3F of the clock CLK in response to the second internal command MRW2, and generates the second latch addresses LAD2<1:4>.

At a point of time T4, the test mode signal generation circuit 32 generates the test mode signal TCM by the first latch addresses LAD1<1:4> generated at the third rising edge 3R of the clock CLK and the second latch addresses LAD2<1:4> generated at the third falling edge 3F of the clock CLK.

The test circuit 40 is set with the parameter of an internal operation by the test command TBM and the test mode signal TCM of the logic high levels. The parameter of the internal operation set by the test mode signal TCM may be set as a tCAS (CAS active time).

The internal command generation circuit 220 generates the first internal command MRW1 which is generated in synchronization with a fourth rising edge 4R of the clock CLK, in response to the test command TBM of the logic high level. The fourth rising edge 4R means the fourth rising edge of the clock CLK after the test command TBM is generated.

The latch circuit 31 latches the command addresses CA<1:4> synchronized with the fourth rising edge 4R of the clock CLK in response to the first internal command MRW1, and generates the first latch addresses LAD1<1:4>.

The internal command generation circuit 220 generates the second internal command MRW2 which is generated in synchronization with a fourth falling edge 4F of the clock CLK, in response to the test command TBM of the logic high level. The fourth falling edge 4F means the fourth falling edge of the clock CLK after the test command TBM is generated.

The latch circuit 31 latches the command addresses CA<5:8> synchronized with the fourth falling edge 4F of the clock CLK in response to the second internal command MRW2, and generates the second latch addresses LAD2<1:4>.

At a point of time T5, the test mode signal generation circuit 32 generates the test mode signal TCM by the first latch addresses LAD1<1:4> generated at the fourth rising edge 4R of the clock CLK and the second latch addresses LAD2<1:4> generated at the fourth falling edge 4F of the clock CLK.

The test circuit 40 is set with the parameter of an internal operation by the test command TBM and the test mode signal TCM of the logic high levels. The parameter of the internal operation set by the test mode signal TCM may be set as a tRP (RAS precharge time).

The internal command generation circuit 220 generates the first internal command MRW1 which is generated in synchronization with a fifth rising edge 5R of the clock CLK, in response to the test command TBM of the logic high level. The fifth rising edge 5R means the fifth rising edge of the clock CLK after the test command TBM is generated.

The latch circuit 31 latches the command addresses CA<1:4> synchronized with the fifth rising edge 5R of the clock CLK in response to the first internal command MRW1, and generates the first latch addresses LAD1<1:4>.

The internal command generation circuit 220 generates the second internal command MRW2 which is generated in synchronization with a fifth falling edge 5F of the clock CLK, in response to the test command TBM of the logic high level. The fifth falling edge 5F means the fifth falling edge of the clock CLK after the test command TBM is generated.

The latch circuit 31 latches the command addresses CA<5:8> synchronized with the fifth falling edge 5F of the clock CLK in response to the second internal command MRW2, and generates the second latch addresses LAD2<1:4>.

At a point of time T6, the test mode signal generation circuit 32 generates the test mode signal TCM by the first latch addresses LAD1<1:4> generated at the fifth rising edge 5R of the clock CLK and the second latch addresses LAD2<1:4> generated at the fifth falling edge 5F of the clock CLK.

The test circuit 40 is set with the parameter of an internal operation by the test command TBM and the test mode signal TCM of the logic high levels. The parameter of the internal operation set by the test mode signal TCM may be set as a tWR (write recovery time).

At a point of time T7, the test command generation circuit 210 generates the test command TBM which is disabled to the logic low level, in response to the burn-in test signal WBI, since the command addresses CA<1:8> are the second combination. The second combination of the command addresses CA<1:8> means the case where all bits of the command addresses CA<1:8> are a logic low level L.

In this way, in the semiconductor system in accordance with an embodiment, since a parameter for an internal operation may be set from command addresses during one cycle of a clock, a test time may be shortened. Moreover, by setting a parameter for performing a test, from command addresses during one cycle of a clock, a test may be performed at a high speed by using test equipment having a low operation speed.

Figure 4:
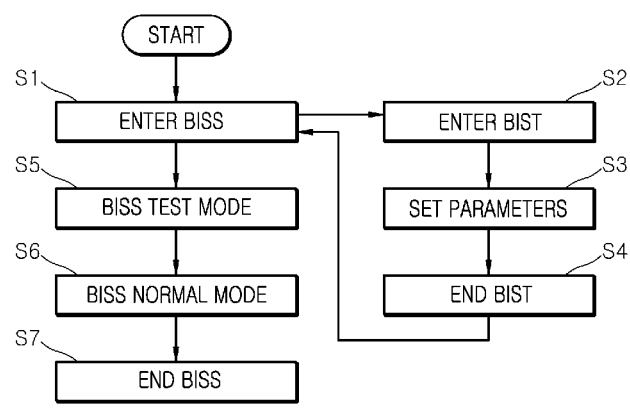
FIG. 4 is a representation of an example of a flow chart to assist in the explanation of a test method in accordance with an embodiment.

A test method in accordance with an embodiment will be described below with reference to FIG. 4.

First, in the case where the burn-in test signal WBI is enabled in the first semiconductor device 1, the second semiconductor device 2 performs BISS entering step S1. BISS means, for example, the first test mode in an embodiment.

The first semiconductor device 1 outputs the command addresses CA<1:8> of the first combination for entering the second test mode.

The second semiconductor device 2 performs BIST entering step S2 by the command addresses CA<1:8> of the first combination. BIST means, for example, the second test mode in an embodiment.

The test command generation circuit 210 generates the test command TBM which is enabled to the logic high level, by the burn-in test signal WBI enabled in the first test mode and the command addresses CA<1:8> of the first combination.

The internal command generation circuit 220 generates the first internal command MRW1 and the second internal command MRW2 which are sequentially enabled during one cycle of the clock CLK, in response to the test command TBM.

The latch circuit 31 latches the command addresses CA<1:4> in response to the first internal command MRW1, and generates the first latch addresses LAD1<1:4>. The latch circuit 31 latches the command addresses CA<5:8> in response to the second internal command MRW2, and generates the second latch addresses LAD2<1:4>.

The test mode signal generation circuit 32 generates the test mode signal TCM by the first latch addresses LAD1<1:4> and the second latch addresses LAD2<1:4>.

The test circuit 40 is set with the parameters of internal operations by the test command TBM and the test mode signal TCM.

In this way, the second semiconductor device 2 performs parameter setting step S3 in which the parameters for the internal operations of the test circuit 40 are set.

The first semiconductor device 1 outputs the command addresses CA<1:8> of the second combination for ending the second test mode.

The second semiconductor device 2 performs BIST ending step S4 by the command addresses CA<1:8> of the second combination. At this time, since the burn-in test signal WBI is in the enabled state, the second semiconductor device 2 performs again the BISS entering step S1.

The second semiconductor device 2 performs BISS test mode step S5 for applying a stress to the test circuit 40.

The second semiconductor device 2 performs BISS normal mode step S6 for performing a repair operation for a circuit in which a failure occurs due to the stress applied to the test circuit 40.

The second semiconductor device 2 performs BISS ending step S7 in the case where the repair operation for the circuit in which a failure occurs is completed. The BISS ending step S7 means the case where the repair operation for the circuit in which a failure occurs is completed.

Figure 5:
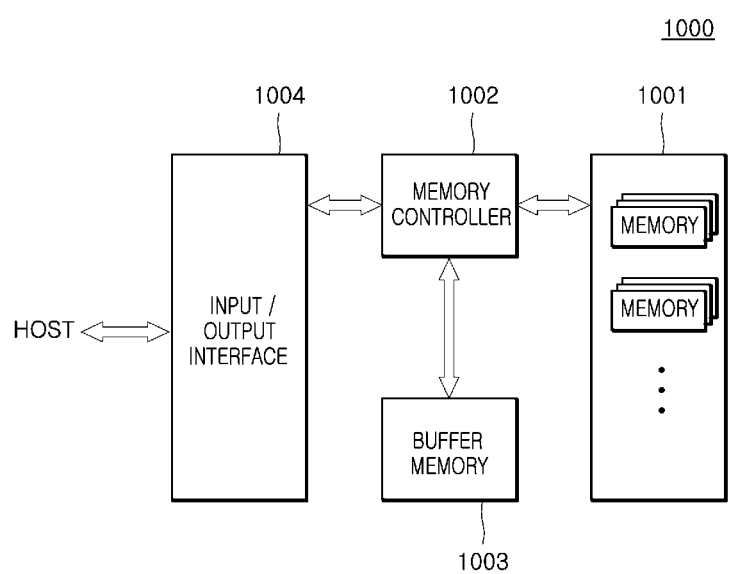
FIG. 5 is a diagram illustrating a representation of an example of the configuration of an electronic system to which the semiconductor system illustrated in FIGS. 1 to 4 may be applied.

The semiconductor devices and the semiconductor systems described above with reference to FIGS. 1 to 4 may be applied to an electronic system which may include, for example but not limited to, a memory system, a graphic system, a computing system or a mobile system. For example, referring to FIG. 5, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the second semiconductor device 2 illustrated in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. The memory controller 1002 may include the first semiconductor device 1 illustrated in FIG. 1. While the memory controller 1002 is illustrated as one block in FIG. 5, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001.

The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as universal serial bus (USB), multi media card (MMC), peripheral component interconnect-express (PCI-E), serial attached small computer system interface (SCSI) (SAS), serial advanced technology attachment (ATA) (SATA), parallel advanced technology attachment (ATA) (PATA), small computer system interface (SCSI), enhanced small device interface (ESDI) and integrated development environment (IDE).

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the test method and the semiconductor system using the same described herein should not be limited based on the described embodiments.

In an embodiment, wherein the first test mode is a test mode for performing a repair operation in a test circuit, including a memory cell array, based on the disablement of the test command.

In an embodiment, the parameter set by the test mode signal may include at least one of a row address strobe (RAS) cycle time (tRC), a RAS active time (tRAS), a column address strobe (CAS) active time (tCAS), a RAS precharge time (tRP), and a write recovery time (tWR).

What is claimed is:

1. A semiconductor system comprising:
   a first semiconductor device configured for outputting a clock, a burn-in test signal and command addresses; and
   a second semiconductor device configured for entering a first test mode in response to the burn-in test signal, entering a second test mode in response to the command addresses, and generating first and second internal commands from the command addresses within one cycle of the clock and setting a parameter in synchronization with the first and second internal commands, in the second test mode,
   wherein the second semiconductor device latches the command addresses in response to the first and second internal commands, and generates a test mode signal from the latched command addresses,
   wherein the test mode signal includes an information for setting the parameter, and
   wherein the parameter includes an information on the internal operation of a test circuit in the second test mode.

2. The semiconductor system according to claim 1, wherein the first internal command is generated in synchronization with a rising edge of the clock, and the second internal command is generated in synchronization with a falling edge of the clock.

3. The semiconductor system according to claim 1, wherein the first test mode is a test mode for applying a stress to the test circuit, and the second test mode is a test mode for controlling an internal operation of the test circuit.

4. The semiconductor system according to claim 1, wherein the second semiconductor device comprises:
   a command generation circuit configured for generating a test command depending upon a combination of the command addresses in response to the burn-in test signal, and generating the first and second internal commands which are sequentially enabled within one cycle of the clock;
   a test control circuit configured for latching the command addresses in response to the first and second internal commands, and generating the test mode signal from the latched command addresses; and
   the test circuit configured for operating by being set with the parameter in response to the test command and the test mode signal.

5. The semiconductor system according to claim 4, wherein the command generation circuit comprises:
   a test command generation circuit configured for generating, in response to the burn-in test signal, the test command which is enabled in the case where the command addresses including a first combination and is disabled in the case where the command addresses including a second combination; and
   an internal command generation circuit configured for generating the first internal command at the rising edge of the clock and generating the second internal command at the falling edge of the clock, in response to the test command.

6. The semiconductor system according to claim 4, wherein the test control circuit comprises:
   a latch circuit configured for generating first latch addresses by latching the command addresses at the rising edge of the clock in response to the first internal command, and generating second latch addresses by latching the command addresses at the falling edge of the clock in response to the second internal command; and
   a test mode signal generation circuit configured for generating the test mode signal in response to the first and second latch addresses.

7. A semiconductor device comprising:
   a command generation circuit configured for generating a test command depending upon a combination of command addresses in response to a burn-in test signal, and generating first and second internal commands which are sequentially enabled within one cycle of a clock;
   a test control circuit configured for latching the command addresses in response to the first and second internal commands, and generating a test mode signal from the latched command addresses; and
   a test circuit configured for entering a test mode in response to the test command and the test mode signal, and operating by being set with a parameter in the test mode,
   wherein the test mode signal includes an information for setting the parameter,
   wherein the parameter includes an information on an internal operation of the test circuit in the test mode.

8. The semiconductor device according to claim 7, wherein the first internal command is generated in synchronization with a rising edge of the clock, and the second internal command is generated in synchronization with a falling edge of the clock.

9. The semiconductor device according to claim 7, wherein the command generation circuit comprises:
a test command generation circuit configured for generating, in response to the burn-in test signal, the test command which is enabled in the case where the command addresses including a first combination and is disabled in the case where the command addresses including a second combination; and
an internal command generation circuit configured for generating the first internal command at the rising edge of the clock and generating the second internal command at the falling edge of the clock, in response to the test command.

10. The semiconductor device according to claim 7, wherein the test control circuit comprises:
a latch circuit configured for generating first latch addresses by latching the command addresses at the rising edge of the clock in response to the first internal command, and generating second latch addresses by latching the command addresses at the falling edge of the clock in response to the second internal command; and
a test mode signal generation circuit configured for generating the test mode signal in response to the first and second latch addresses.

11. A test method comprising:
entering a first test mode for applying a stress to a test circuit in response to a burn-in test signal; and
entering a second test mode in the case where command addresses including a first combination, and generating first and second internal commands from the command addresses within one cycle of a clock and setting a parameter of the test circuit in synchronization with the first and second internal commands, in the second test mode,
wherein the step of entering the second test mode comprises generating first latch addresses by latching the command addresses at the rising edge of the clock in response to the first internal command, generating second latch addresses by latching the command addresses at the falling edge of the clock in response to the second internal command, and generating a test mode signal from the first and second latch addresses,
wherein the test mode signal includes an information for setting the parameter, and
wherein the parameter includes an information on an internal operation of the test circuit in the test mode.

12. The test method according to claim 11, wherein the first internal command is generated in synchronization with a rising edge of the clock, and the second internal command is generated in synchronization with a falling edge of the clock.

13. The test method according to claim 11, wherein the test method reenters the first test mode as the second test mode is ended in the case where the command addresses including a second combination.

14. The test method according to claim 11, wherein the first test mode is a test mode for applying the stress to the test circuit, and the second test mode is a test mode for controlling an internal operation of the test circuit.

15. The test method according to claim 11, wherein the step of entering the second test mode further comprises:
generating a test command which is enabled in the case where a combination of the command addresses including the first combination, in response to the burn-in test signal, and generating the first and second internal commands which are sequentially enabled within one cycle of the clock; and
setting the parameter in response to the test command and the test mode signal, and performing the internal operation.

16. A command generation circuit comprising:
a test command generation circuit configured for receiving command addresses and burn-in test signal, to generate a test command which is enabled in response to the command addresses including a first combination and the burn-in test signal, and to generate the test command which is disabled in response to the command addresses including a second combination and the burn-in test signal; and
an internal command generation circuit configured to receive a clock signal and the test command from the test command generation circuit, and generate a first and second internal commands which are enabled within one cycle of a clock,
a test control circuit configured for latching the command addresses in response to the first and second internal commands, and generating a test mode signal from the latched command addresses,
wherein the test mode signal includes an information for setting a parameter, and
wherein the parameter includes an information on an internal operation of the test circuit in the test mode.

17. The command generation circuit according to claim 16,
wherein the first internal command is generated in synchronization with a rising edge of the clock signal, in response to the test command, and
wherein the second internal command is generated in synchronization with a falling edge of the clock signal, in response to the test command.

18. The command generation circuit according to claim 16,
wherein the test command is enabled to a logic high level in response to the burn-in test signal being enabled and all the bits of the command addresses being a logic high level, and
wherein the test command is disabled to a logic low level in response to the burn-in test signal being enabled and all of the bits of the command addresses being a logic low level.

19. The command generation circuit according to claim 16,
wherein the test command signal is used for performing a repair operation.

* * * * *